United States Patent
Hanazaki et al.

[11] Patent Number: 6,024,105
[45] Date of Patent: Feb. 15, 2000

[54] SEMICONDUCTOR MANUFACTURING DEVICE AND METHOD OF REMOVING PARTICLES THEREFROM

[75] Inventors: Minoru Hanazaki; Masaaki Tsuchihashi, both of Hyogo, Japan

[73] Assignee: Mitsubishi Denki Kabushiki Kaisha, Tokyo, Japan

[21] Appl. No.: 09/019,702

[22] Filed: Feb. 6, 1998

[30] Foreign Application Priority Data

Aug. 7, 1997 [JP] Japan .................................. 9-213326

[51] Int. Cl.⁷ ...................................................... B08B 3/02
[52] U.S. Cl. ........................ 134/1.3; 134/902; 134/104.1; 438/905; 438/906; 156/345
[58] Field of Search .............................. 156/345; 134/1.3, 134/25.4, 104.1, 902; 438/905, 906

[56] References Cited

U.S. PATENT DOCUMENTS

| | | |
|---|---|---|
| 4,316,750 | 2/1982 | Gengler . |
| 5,141,009 | 8/1992 | Morantz . |
| 5,186,192 | 2/1993 | Netsu . |
| 5,238,871 | 8/1993 | Sato . |
| 5,328,555 | 7/1994 | Gupta . |
| 5,456,796 | 10/1995 | Gupta et al. . |
| 5,496,506 | 3/1996 | Sato . |
| 5,531,862 | 7/1996 | Otsubo et al. . |
| 5,555,902 | 9/1996 | Menon . |
| 5,679,215 | 10/1997 | Barnes et al. . |
| 5,700,741 | 12/1997 | Liao . |
| 5,792,275 | 8/1998 | Natzle et al. . |
| 5,811,356 | 9/1998 | Murugesh et al. . |
| 5,843,239 | 12/1998 | Shrotriya . |
| 5,857,474 | 1/1999 | Sakai et al. . |
| 5,873,380 | 2/1999 | Kanno . |
| 5,888,906 | 3/1999 | Sandhu et al. . |
| 5,934,566 | 8/1999 | Kanno et al. . |
| 5,947,136 | 9/1999 | Abras . |

FOREIGN PATENT DOCUMENTS 6-295882  10/1994  Japan .

*Primary Examiner*—Frankie L. Stinson
*Attorney, Agent, or Firm*—McDermott, Will & Emery

[57] ABSTRACT

An introduction pipe for gas or the like for introducing water or water vapor is connected to a vacuum process chamber. The vacuum process chamber is evacuated through an evacuation exhaust port, and the introduced water vapor or water is solidified or liquefied by adiabatic expansion using a floating fine particle as a core. The particle on which the water vapor or the like is solidified or liquefied is discharged outside the vacuum process chamber. Thus, a semiconductor manufacturing device capable of reducing the number of fine particles on a wafer without decreasing uptime ratio is achieved.

19 Claims, 9 Drawing Sheets

FIG.3A

VACUUM PROCESS CHAMBER

FINE PARTICLE

BEFORE INTRODUCTION OF WATER VAPOR

FIG.3B

WATER VAPOR

ICE IS PRODUCED ON A PARTICLE AS A CORE

WATER IS INTRODUCED INTO DEPRESSURIZED PROCESS CHAMBER

FIG.3C

EVACUATION

EVACUATION IS PERFORMED

SEMICONDUCTOR MANUFACTURING DEVICE AND METHOD OF REMOVING PARTICLES THEREFROM

BACKGROUND OF THE INVENTION

1. Field of the Invention

The present invention relates to semiconductor manufacturing devices and methods of removing foreign matters or particles therefrom, and particularly, to a semiconductor manufacturing device capable of reducing fine particles floating in a process chamber of the semiconductor manufacturing device and a method of removing the particles.

2. Description of the Background Art

Recently, development of electronics is conspicuous, which has largely depended on the technological advancement in manufacturing technique, including advancement in devices for manufacturing semiconductor devices. In a wafer process including a series of steps for forming a semiconductor device from a silicon wafer, a semiconductor wafer (hereinafter simply referred to as "a wafer") is processed in a variety of semiconductor manufacturing devices and completed as a product.

As the degree of integration of the semiconductor devices has been increased, processes for fine patterns are required. Accordingly, how to keep the wafer in wafer processing clean has become one of the major objects, and particularly, the need for a semiconductor manufacturing device having less particles has increased.

As an example of such a semiconductor manufacturing device, a dry etching system for processing a wafer in a vacuum will be described with reference to the drawings. Referring to FIG. 7, a lower electrode 20 as a sample stage is formed in the lower portion of a vacuum process chamber 10. Lower electrode 20 and vacuum process chamber 10 are electrically insulated by an insulator 11. A wafer 50 is placed on lower electrode 20. A high frequency (for example of 13.56 MHz) power supply 23 is connected to lower electrode 20 through a blocking condenser 22 for generating bias and through a high frequency matching circuit 21. An upper electrode 40 is also formed opposite to lower electrode 20 in vacuum process chamber 10. A supply opening 42 is formed on upper electrode 40 which blows off the gas supplied from a supplier 41 for supplying prescribed gas. Vacuum process chamber 10 is evacuated by an evacuation exhaust port 12 connected to an exhaust unit (not shown). In addition, a pressure gauge 13 for measuring pressure in vacuum process chamber 10 is provided through a pressure gauge portion 14.

An etching operation using the above mentioned dry etching system will now be described. Referring again to FIG. 7, wafer 50 which has been transported into vacuum process chamber 10 by a handling system (not shown) is placed on lower electrode 20. Then, etching gas is flowed into a discharge space 30 through a supply opening 42 from supplier 41. The pressure in vacuum process chamber 10 is controlled to a prescribed level by pressure gauge 13 and an exhaust conductance controller (not shown). After the pressure control, high frequency power is applied to lower electrode 20 by high frequency power supply 22. Thus, glow discharge occurs between lower and upper electrodes 20 and 40. Etching gas in discharge space 30 is excited into plasma 31 by the glow discharge. When the surface of wafer 50 is irradiated with plasma 31, an etching process is performed.

In the etching process, component under etching of wafer 50 reacts with activated species in plasma 31. The reaction product evaporates, goes away from the surface of wafer 50 and spreads into discharge space 30. Finally, the reaction product is discharged from evacuation exhaust port 12. At this time, part of the evaporated reaction product may experience polymerization reaction or the like and is solidified in discharge space 30. In addition, part of the evaporated reaction product may be cooled on the wall surface of vacuum process chamber 10 and solidified again.

The reaction product thus adhered for example to the wall surface of vacuum process chamber 10 and solidified becomes thicker as the etching process proceeds, until it becomes a solid deposit 60. Solid deposit 60 is eventually removed off from the wall surface of vacuum process chamber 10 and externally discharged, or falls on wafer 50. The solid deposit on wafer 50 may hinder etching, resulting in decrease in the productivity of wafers.

On the other hand, most of the reaction products which have been solidified in discharge space 30 have fine diameters no larger than submicrons. These reaction products are charged by plasma or collided with neutral particles to form particles 70, most of which float in discharge space 30 for a long period of time.

Various proposals have been made as to removal of particles in such a vacuum process chambers, and more specifically, of solid deposition 60 which has been adhered to the wall surface of vacuum process chamber 10. In Japanese Patent Laying-Open No. 6-295882, for example, one method of preventing adhesion of reaction product is disclosed in which the wall surface of a vacuum process chamber is heated above the evaporating temperature of the reaction product by a heater or the like. In addition, a cleaning method by means of plasma has been generally adopted.

The removal of the particles in the above described dry etching system, however, suffers from the following problems.

It has been reported that there exists such a relation between the size of the particle which affects yield of wafers and a design rule, as shown in FIG. 8. According to the relation, a particle having a diameter of around 0.1 $\mu$m would affect yield of 1 G-DRAMs, the production of which would begin around the year 2000.

Meanwhile, there exists such a relation between the size and the number of the particles generally existing in a certain space, as shown in FIG. 9. According to the relation shown in FIG. 9, it is apparent that the particles having smaller diameters are larger in number. It is known that a fine particle in particular floats in the space within a vacuum chamber for a long period of time even under a depressurized state as in the atmosphere, once it is produced. This is now explained in detail using the drawing. Artificial particles having diameters of 0.3 to 2 $\mu$m are introduced into an enclosed space, and the relation between the time after stopping the supply of the particles and the number of particles existing in the space is obtained by a particle counter. The result is shown in FIG. 10. According to the result, under atmospheric pressure (760 Torr), there was not a large decrease in the number of the particles relative to the time elapsed after the stop of supply. On the other hand, under the depressurized state (12 Torr), while the number of the particles decreased as time passed, the particles could float in a space at least for 20 minutes. Accordingly, it is estimated that the particles having diameters of about 0.1 $\mu$m, which is smaller than the minimum diameter of the artificial particles, would float in the space for a longer period of time.

Such fine particles cannot have been effectively removed by the conventional method of removing mainly the particles on the wall surface of the vacuum process chamber. In addition, fine particles have often been produced in removing the particles on the wall surface, disadvantageously increasing the number of the particles floating in the vacuum process chamber.

The operation of the dry etching device may also be stopped and manually cleaned. In this case, however, though almost all of the fine particles can be removed, uptime ratio of the dry etching device and hence productivity decrease.

SUMMARY OF THE INVENTION

The present invention is made to solve the aforementioned problems. One object of the present invention is to provide a semiconductor manufacturing device capable of readily removing a fine particle in a process chamber. Another object of the present invention is to provide a method of removing the particle in the process chamber.

A semiconductor manufacturing device according to one aspect of the present invention includes a process chamber, an introduction pipe and an exhaust unit. The process chamber provides a prescribed process for a semiconductor substrate. The introduction pipe introduces prescribed liquid or gas into the process chamber. The exhaust unit evacuates the process chamber, and solidifies or liquefies the liquid or gas introduced in the process chamber by adiabatic expansion using a particle floating in the process chamber as a core.

According to the structure, the process chamber is depressurized by the exhaust unit. The liquid or gas introduced in the process chamber by the introduction pipe is cooled by adiabatic expansion. At this time, the introduced liquid or gas becomes solid or liquid using a particle floating in the process chamber as a core. Thus, the particle increases in weight and readily falls on the lower portion of the process chamber. The particle is also readily discharged outside the process chamber by the exhaust unit. As a result, the number of particles on the semiconductor substrate is reduced.

The introduction pipe is preferably connected near the upper portion of the process chamber.

In this case, the introduced liquid or gas becomes solid or liquid using a particle near the upper portion of the process chamber as a core, and is externally discharged. Thus, the particle floating above the semiconductor substrate is efficiently prevented from sticking on the semiconductor substrate.

More preferably, a carrier gas introduction pipe is included which is connected to the process chamber and introduces carrier gas into the process chamber.

In this case, the introduced liquid or gas becomes solid or liquid on the surface of the particle, and the particle with solid or liquid can be easily and efficiently discharged outside the process chamber with a flow of carrier gas. As a result, the number of particles which adhere on the semiconductor substrate is further decreased.

A method of removing a particle in a semiconductor manufacturing device according to another aspect of the present invention is for a semiconductor manufacturing device with a process chamber including an exhaust unit for performing a prescribed process on a semiconductor substrate. The method includes the step of introducing prescribed liquid or gas into the process chamber, and the step of depressurizing the pressure in the process chamber to a prescribed level by the exhaust unit for solidifying or liquefying the introduced liquid or gas using the particle in the process chamber as a core.

According to the method, the liquid or gas introduced into the process chamber is cooled by adiabatic expansion as the process chamber is evacuated by the exhaust unit. At the time, the introduced liquid or gas becomes solid or liquid using the fine particle floating in the process chamber as a core. Thus, the particle increases in weight and tends to fall on the lower portion of the process chamber. As a result, the number of particles which adhere to the semiconductor substrate is reduced.

Preferably, the depressurizing step is performed before introducing liquid or gas into the process chamber.

In this case, liquid or gas is introduced in the depressurized process chamber. Then, liquid or gas rapidly expands, so that it becomes solid or liquid with higher efficiency using the particle as a core. As a result, the number of particles which adhere to the semiconductor substrate is reduced.

More preferably, the step of evacuating the process chamber by the exhaust unit is included after the step of solidifying or liquefying the liquid or gas.

In this case, a particle having the gas or the like which has been introduced and solidified or liquefied on its surface is discharged outside the process chamber. As a result, the number of particles which would fall on and adhere to the semiconductor substrate can further be reduced.

More preferably, the step of evacuating the process chamber by the exhaust unit is performed simultaneously with the step of solidifying or liquefying the introduced liquid or gas.

In this case, the particle can be discharged as the introduced gas or the like is solidified or liquefied using the particle as a core. Thus, the number of particles which fall on and adhere to the semiconductor substrate can further be reduced.

More preferably, subsequent to the step of evacuating the process chamber, the step of introducing liquid or gas into the process chamber and solidifying or liquefying the introduced liquid or gas by the exhaust unit, and the step of evacuating the process chamber by the exhaust unit are further included.

In this case, a series of steps is repeated in which the introduced gas or the like is solidified or liquefied using the fine particle in the process chamber as a core, and the particle is discharged outside the process chamber. Thus, the fine particle floating in a process chamber is efficiently discharged. As a result, the number of particles which adhere on the semiconductor substrate is further reduced.

More preferably, the step of introducing carrier gas in the process chamber is performed simultaneously with the step of evacuating the process chamber.

In this case, the particle can be discharged outside the process chamber with a flow of carrier gas with higher efficiency. As a result, the number of particles which adhere on the semiconductor substrate is further reduced.

In the step of introducing liquid or gas, liquid or gas is preferably introduced near the upper portion of the process chamber.

In this case, the introduced gas or the like is solidified or liquefied using the fine particle near the upper portion of the process chamber, and discharged outside the process chamber. As a result, the fine particle floating above the semiconductor substrate is prevented from adhering on the semiconductor substrate.

Preferably, one of liquid water, vapor or carbon dioxide is used as the above mentioned liquid or gas. As carrier gas, inactive gas or dry air is used.

These are all relatively frequently used is manufacturing lines and readily applicable on a semiconductor manufacturing line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A, 3B and 3C respectively show first to third state related to the effect of removing particles.

DESCRIPTION OF THE PREFERRED EMBODIMENTS

First Example

Figure 1:
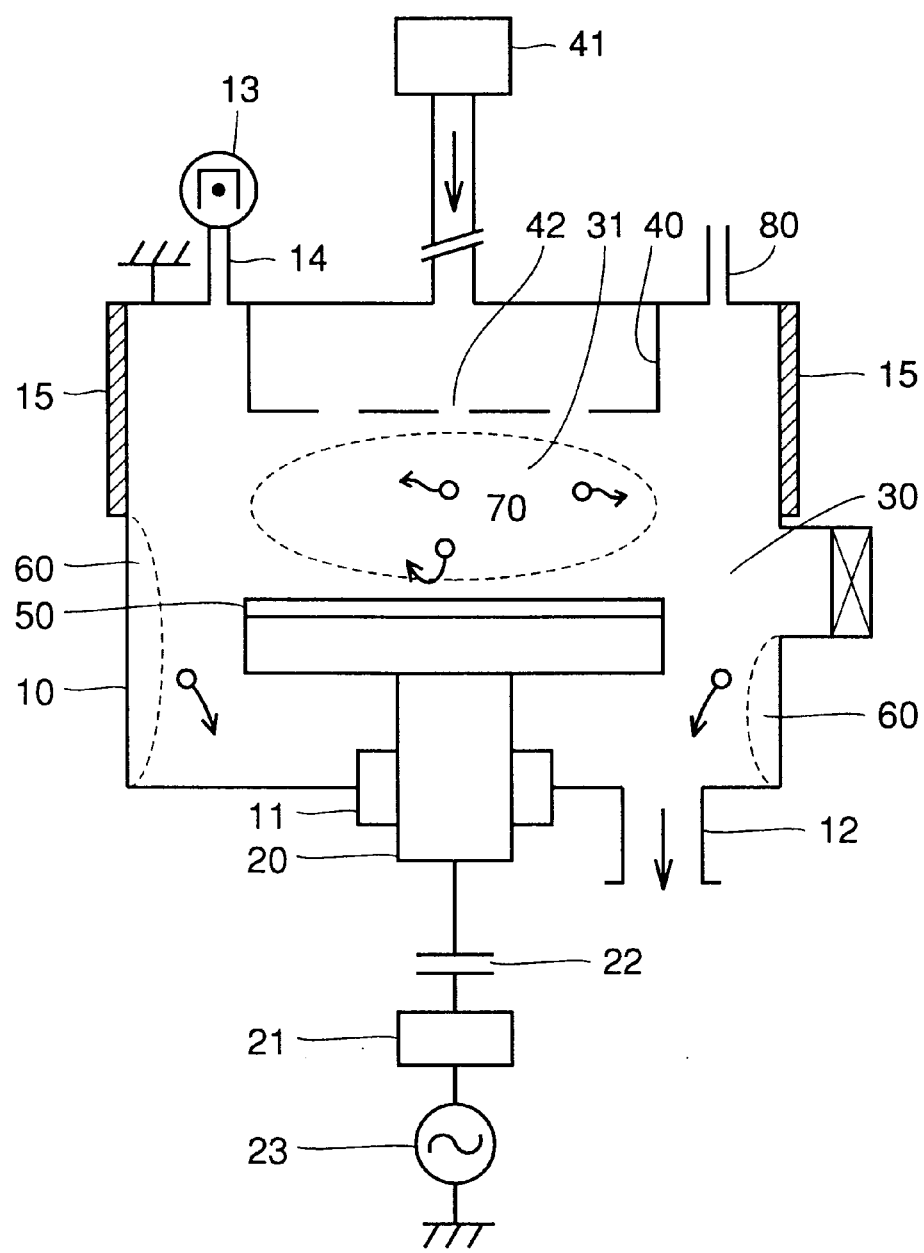
FIG. 1 is a cross sectional view showing a dry etching device according to a first example of the present invention.

A dry etching device according to a first example and a method of removing a particle therefrom will now be described with reference to the drawings. Referring to FIG. 1, a pipe for introducing gas or liquid for removing a particle (hereinafter referred to as "introduction pipe") 80 is connected to a vacuum process chamber 10, for introducing gas or liquid for removing the particle. A heater 15 is provided for removing the particle on the wall surface of vacuum process chamber 10. It is noted that other parts of the structure are almost the same as those for the above described conventional dry etching device, so that the same element has the same reference numeral and the description thereof will not be repeated here.

The method of removing a particle in the above described dry etching device will now be described. First, a prescribed etching process was continuously repeated twenty five times. Thereafter, 500 sccm of water vapor approximately at 90° C. with pressure lower than atmospheric pressure was introduced into vacuum process chamber 10 with degree of vacuum at about 0.01 Torr for about 5 seconds by introduction pipe 80. Then, vacuum process chamber 10 was depressurized to degree of vacuum at about 0.01 Torr. A wafer 50 was transported into vacuum process chamber 10 and placed on a lower electrode 20. Prescribed etching gas was introduced into vacuum process chamber 10 by a supply opening 42 for five seconds. After vacuum process chamber 10 was evacuated for about 1 minute without generating plasma and the degree of vacuum was decreased to 0.01 Torr, wafer 50 was removed from vacuum process chamber 10. The number and the size of the particles on the removed wafer (wafer A) were evaluated.

Similar evaluation result was obtained for an example with no water vapor introduced into vacuum process chamber 10, for comparison. More specifically, after repeating the prescribed etching process twenty five times, a wafer was placed on a lower electrode 20 in vacuum process chamber 10 with degree of vacuum at about 0.01 Torr. Etching gas was introduced into vacuum process chamber 10 for five seconds, and vacuum process chamber 10 was evacuated for about one minute without generating plasma. Degree of vacuum was decreased to 0.01 Torr, and the wafer was removed from vacuum process chamber 10. The particle on the removed wafer (a wafer B) was similarly evaluated.

Figure 2A:
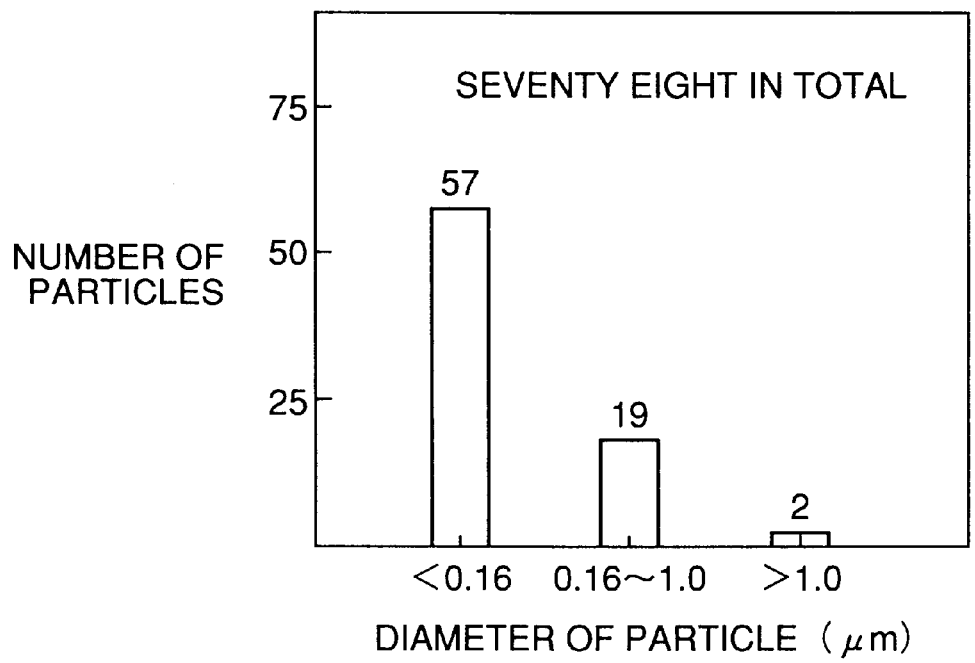
FIGS. 2A and 2B are diagrams showing evaluation results of the number of particles in the first example, where a shows the case in which water vapor is not introduced and b shows the case in which water vapor is introduced.
Figure 2B:
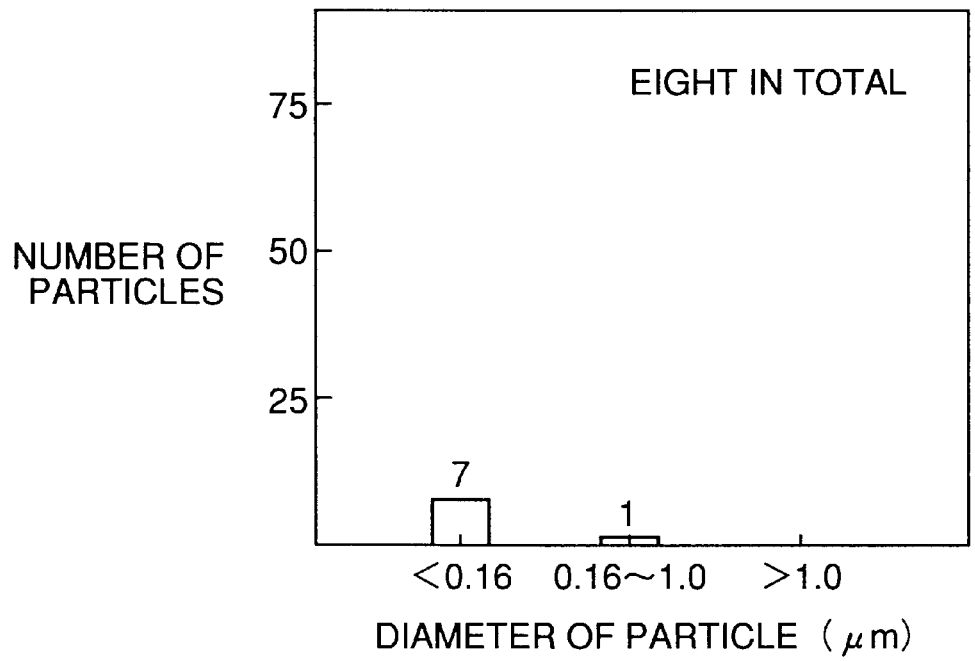

The evaluation results will now be described. FIGS. 2A and 2B respectively show the evaluation results for wafers B and A. Referring to FIG. 2A, when no water vapor was introduced, the number of particles on the wafer was seventy eight, fifty seven of which were fine particles having diameters of 0.16 $\mu$m at most.

On the other hand, referring to FIG. 2B, when water vapor was introduced, the number of particles on the wafer was eight, seven of which were fine particles having diameters of 0.16 $\mu$m at most. As a result, it was confirmed that introduction of water vapor could largely decreased the number of fine particles in the vacuum process chamber.

The above obtained result can be explained as follows. As shown in FIG. 3A, fine particles float in the vacuum process chamber before water vapor was introduced. As shown in FIG. 3B, by introducing water vapor in the depressurized vacuum process chamber, the water vapor cooled by adiabatic expansion, and solidified or liquefied using a floating fine particle as a core. The particle, on which water vapor was solidified or liquefied increases in weight, began to fall on the lower portion of the vacuum process chamber to be discharged outside the vacuum process chamber by an exhaust unit as shown in FIG. 3C. In other words, the number of fine particles on the wafer was decreased due to the effect that the particle which has increased in weight falls on the lower portion of the vacuum process chamber and that the particle is discharged outside the vacuum process chamber by the exhaust unit.

Second Example

A method of removing a particle according to a second example will now be described. The decrease in the number of fine particles on the wafer was explained in terms of the effect that the particle which has been increased in weight falls on the lower portion of vacuum process chamber and that the particle is discharged outside the vacuum process chamber by the exhaust unit, according to the first example. Accordingly, in order to evaluate the effect due to the fall of the particle which has been increased in weight, the particle on the wafer was evaluated without evacuating the vacuum process chamber after introducing water vapor into the vacuum process chamber.

In this case, the number of particles on the wafer was twenty-two. Thus, increasing the weight of fine particles floating in a process chamber so that they can fall down was also proved effective in reducing the number of the particles on the wafer to some extent.

Third Example

A method of removing a particle according to a third example will be described. In the first example, the vacuum process chamber was evacuated after introducing prescribed water vapor for five seconds. The same evacuation was performed simultaneously with introduction of water vapor.

In this case, the number of the particles on the wafer was found seven from the similar evaluation of the particle.

It is noted that while water vapor was continuously introduced in the vacuum process chamber, exactly the same effect of reducing the number of particles was obtained even when water vapor was introduced intermittently. Intermittent introduction of water vapor is especially useful when there is not so much change in the pressure in the vacuum process chamber caused by introduction of water vapor and the exhaust system is not large in volume.

Fourth Example

A method of removing a particle according to a fourth example will be described. In the first to third examples, water vapor was introduced in the vacuum process chamber. Alternatively, liquid water may be introduced. In other words, after a prescribed etching process, the pressure in the vacuum process chamber was set at atmospheric pressure (760 Torr). Water introduced by 0.2 cc in the vacuum process chamber by liquid mass flow. Then, the pressure in the vacuum process chamber was reduced to 1 Torr.

When the particles were similarly evaluated, it was found that the number of particles on the wafer was forty-six. Accordingly, introduction of liquid water into the vacuum process chamber was also proved effective in reducing the number of particles on a wafer.

Figure 4:
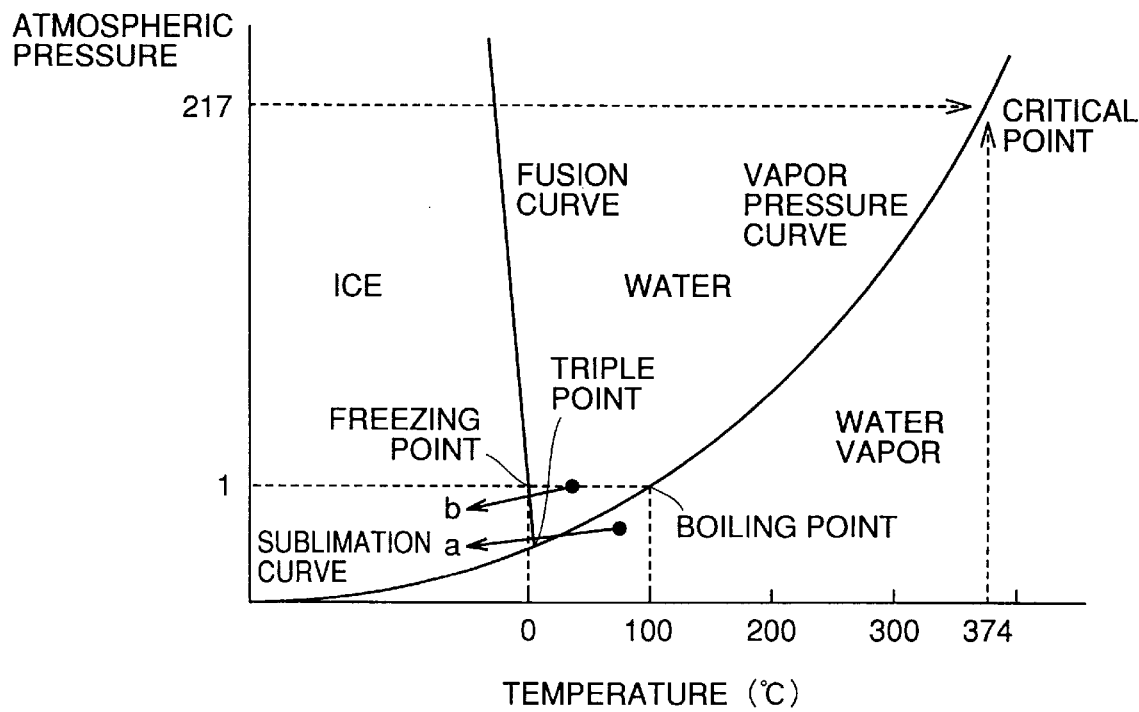
FIG. 4 is a diagram showing the state of water related to the effect of removing particles in first to fourth examples.

Now, how the number of particles on the wafer was reduced in the above described first to fourth examples will be described with reference to a diagram showing the state of water. With reference to FIG. 4, the first to third examples are assumed to correspond to an arrow a in the diagram. More specifically, when water vapor was introduced into the vacuum process chamber at about 0.01 Torr, the temperature of the water vapor decreased by adiabatic expansion, due to decrease in pressure. The water vapor was solidified or liquefied using a fine particle floating in a discharge space as a core. Thus, the fine particle increased in weight and fell on the lower portion of the vacuum process chamber to be discharged outside the vacuum process chamber by an exhaust unit (not shown). As a result, the number of fine particles to adhere on the wafer could be reduced.

Meanwhile, the fourth example is assumed to correspond to an arrow b in the diagram. More specifically, as liquid water is introduced into the vacuum process chamber at atmospheric pressure, the temperature of water decreased due to adiabatic expansion by evacuating the vacuum process chamber. The water was solidified using a fine particle floating in the vacuum process chamber as a core. Thus, the fine particle increased in weight and fell on the lower portion of the vacuum process chamber to be discharged outside the vacuum process chamber by an exhaust unit (not shown). As a result, the number of fine particles on the wafer could be reduced.

It is noted that while water vapor was introduced into the vacuum process chamber by introduction pipe 80, a similar effect can be obtained even when water vapor is introduced from supply opening 42 for introducing prescribed etching gas into the vacuum process chamber.

Fifth Example

A method of removing a particle according to a fifth example will now be described. In the first example, the vacuum process chamber was evacuated after introduction of water vapor into the vacuum process chamber. Nitride gas as carrier gas may be introduced into the vacuum process chamber simultaneously with evacuation of the vacuum process chamber.

More specifically, 50 sccm of nitrogen gas was introduced by another pipe (not shown) provided in vacuum process chamber 10. The vacuum process chamber was evacuated simultaneously with introduction of the nitrogen gas.

In this case, the number of the particles on the wafer was found six through a similar evaluation of the particle. This can be explained that the number of fine particles on the wafer was decreased as a flow of nitrogen gas was formed in the vacuum process chamber, through which the particle was effectively discharged outside the process chamber.

It is noted that any inactive gas other than nitrogen gas may be introduced into the vacuum process chamber, and a similar effect can be obtained also with dry air or rare gas such as He.

Sixth Example

Figure 5:
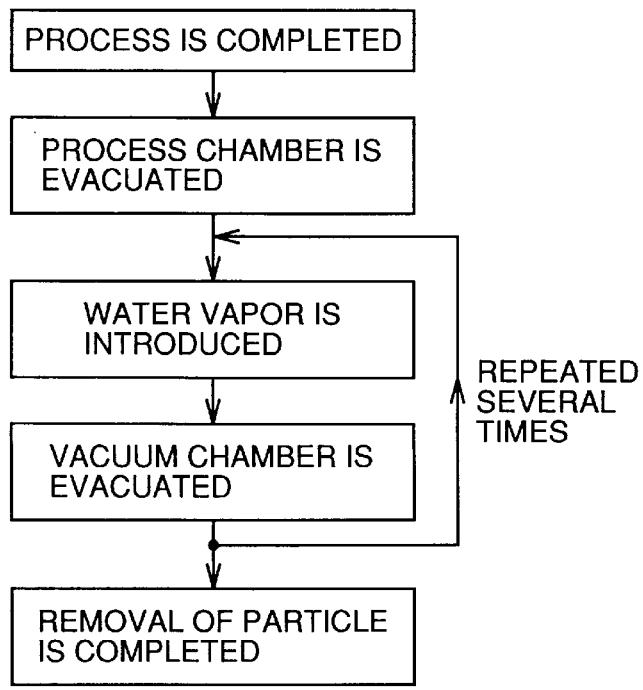
FIG. 5 is a first diagram showing a process flow in accordance with a sixth example of the present invention.

A method of removing a particle according to a sixth embodiment will now be described. By repeating the above described steps of removing the particles several times, further reduction in the number of fine particles on the wafer can be achieved. More specifically, referring to FIG. 5, water vapor was introduced into the vacuum process chamber and a series of steps for evacuating the vacuum process chamber was repeated three times. In this case, the number of particles on the wafer was found three through a similar evaluation of the particles.

Figure 6:
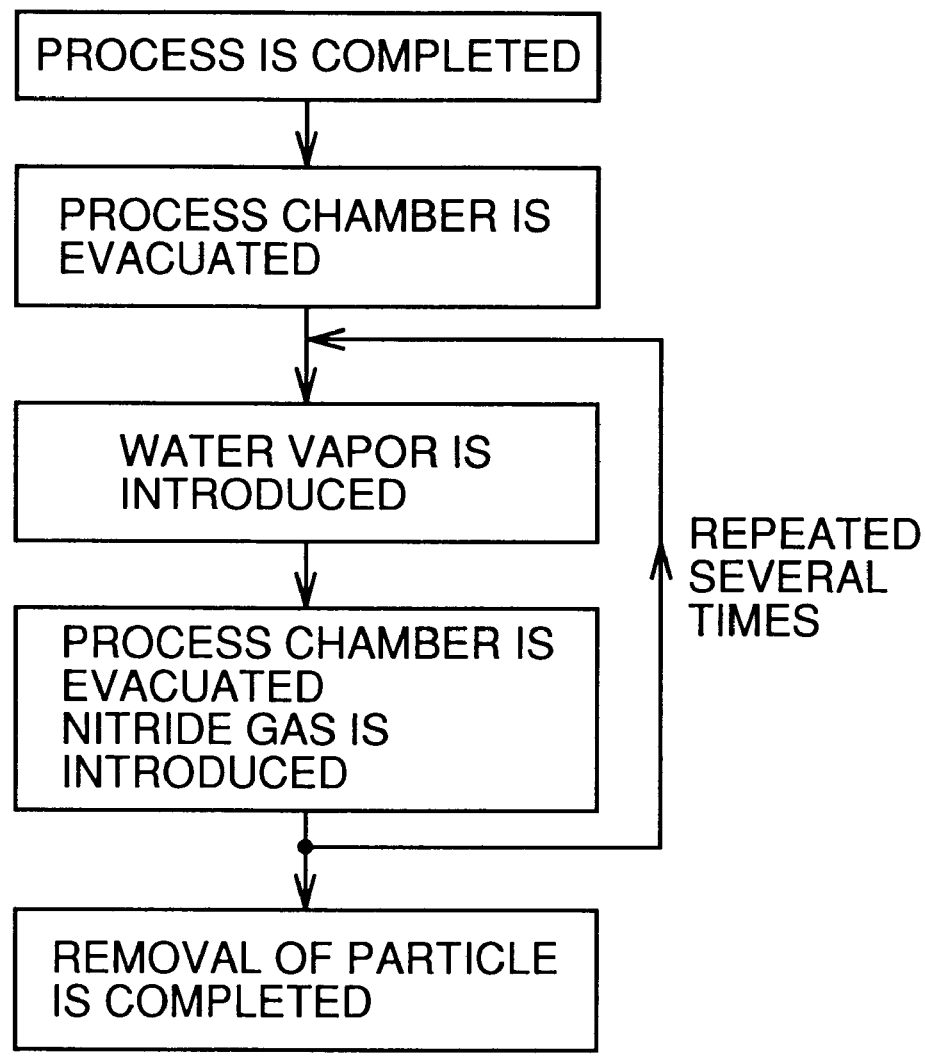
FIG. 6 is a diagram showing a second flow according to the sixth example.
Figure 7:
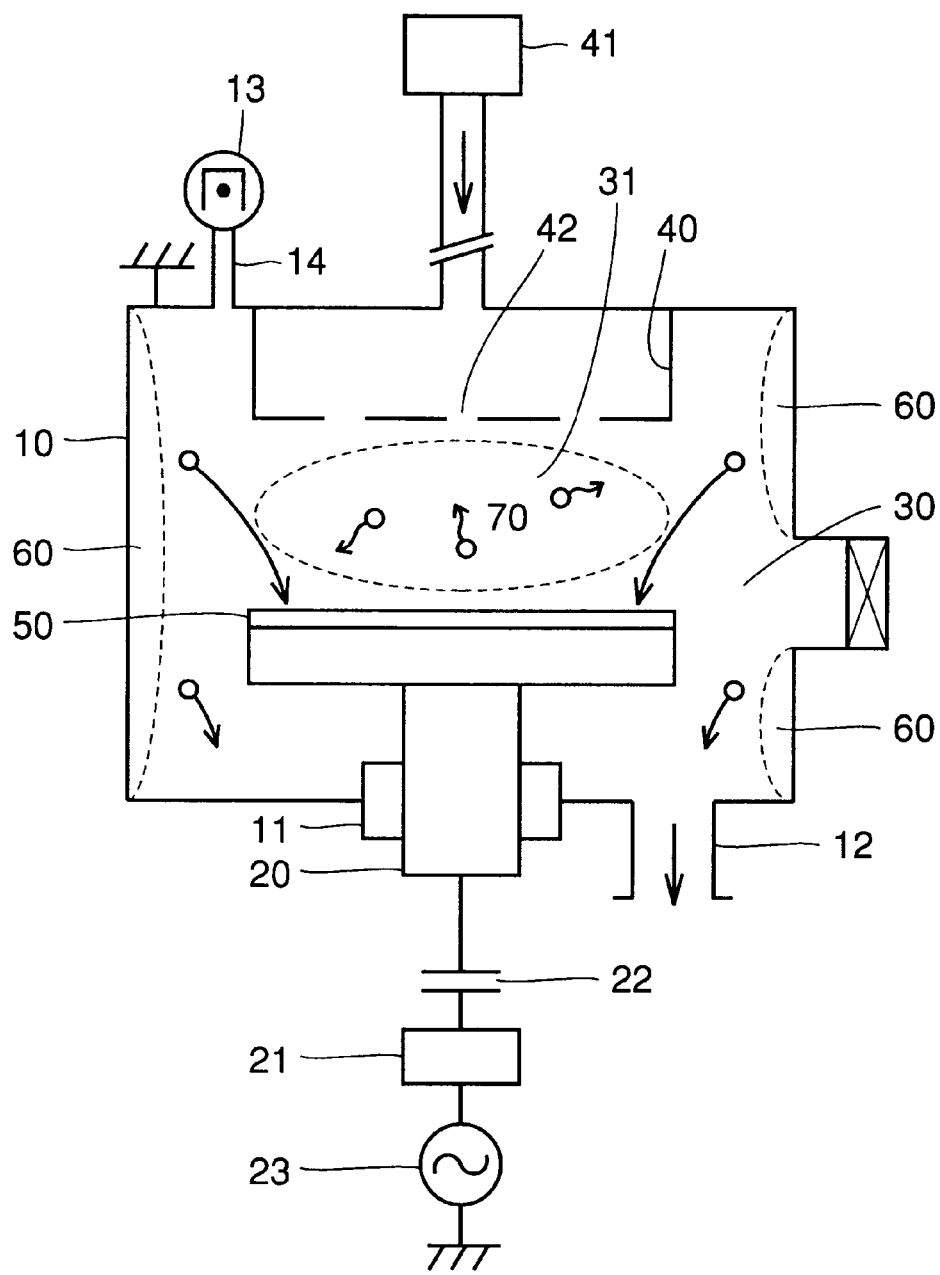
FIG. 7 is a cross sectional view showing a conventional dry etching device.
Figure 8:
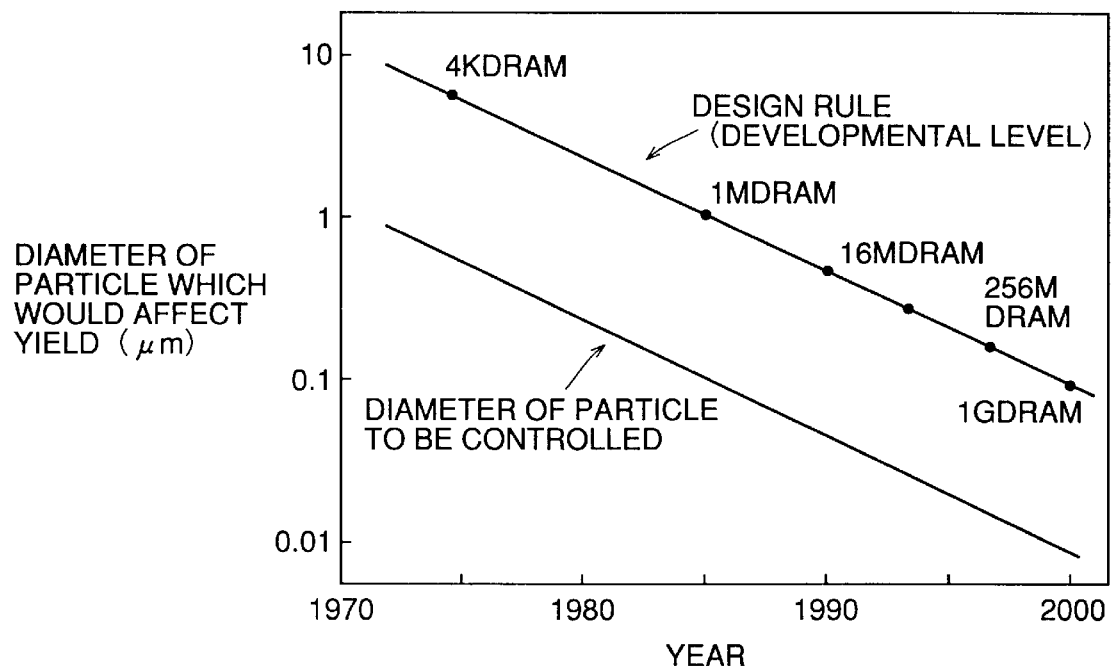
FIG. 8 is a diagram showing a relation between design rule of the semiconductor device and the size of a particle which affects yield of the semiconductor device.
Figure 9:
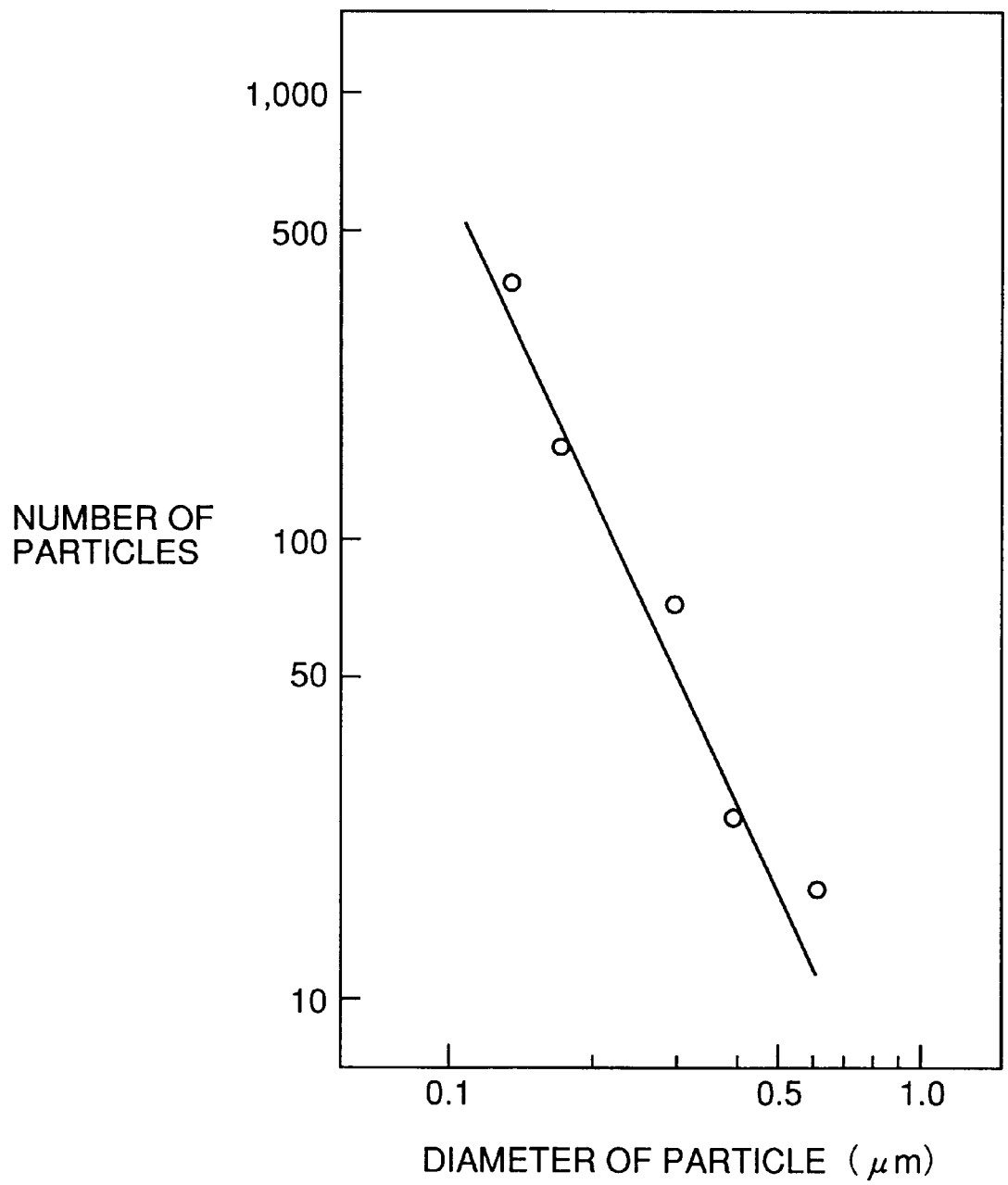
FIG. 9 is a diagram showing a relation between the size of a particle in a certain space and the number thereof.
Figure 10:
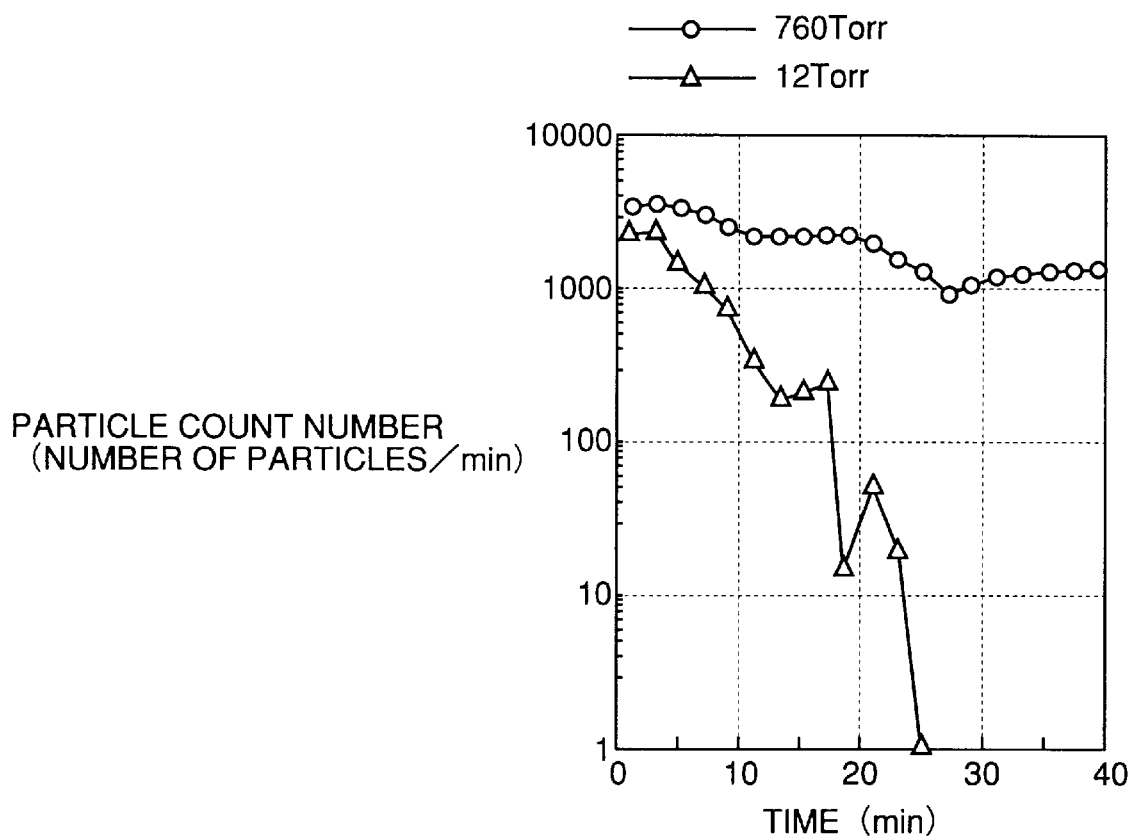
FIG. 10 is a graph showing the result obtained from measuring the number of particles floating in the space of a vacuum process chamber in the conventional dry etching device.

Referring also to FIG. 6, a series of steps including introduction of water vapor into the vacuum process chamber, evacuation of the vacuum process chamber and introduction of nitrogen gas into the vacuum process chamber, was repeated three times. Again, the number of particles on the wafer was found three.

As in the foregoing, by repeating a series of steps for removing the particles, further reduction in the number of particles on the wafer can be achieved.

In the examples described hereinbefore, removal of particles was performed after a prescribed etching process for evaluation. However, it is needless to say that same effect is obtained in removing particles when particles are removed before or during the prescribed etching process. In addition, a series of steps for removing particles can be performed without stopping the operation of dry etching device, so that uptime ratio of the dry etching device can largely be improved.

In each of the above described examples, water vapor or liquid water was introduced from the upper portion of the vacuum process device. This is because the introduced gas or the like may be solidified or liquefied using a fine particle floating in the vacuum process chamber as a core and the particle falls down, so that the number of particles in the vacuum process chamber can be reduced.

In removing particles, however, the particle may actually fall on a lower electrode. To solve this problem, a dummy wafer or the like can preliminary be placed on lower electrode 20 shown in FIG. 1. A similar effect can be obtained also by providing a shutter, for example above the lower electrode.

In each of the above described examples, water vapor or liquid water was used. Alternatively, a mixture of alcohol and water may be used. Carbon dioxide may also be used.

Further, a similar effect can be obtained with Ar, Xe, Kr, Ne, $N_2$, CO, methane, propane, or Freon (trademark), all of which tend to be solidified by adiabatic expansion.

Further, while the dry etching device was used as a semiconductor manufacturing device, a similar effect can be obtained with a semiconductor manufacturing device having a process chamber for processing a wafer, such as a low pressure CVD system and a means for evacuating the process chamber.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor manufacturing device, comprising:
   a process chamber for performing a prescribed process on a semiconductor substrate;
   an introduction pipe for introducing prescribed liquid or gas in said process chamber; and
   an exhaust means for evacuating said process chamber to solidify or liquefy by adiabatic expansion said liquid or gas introduced into said process chamber using a particle floating in said process chamber as a core.

2. The semiconductor manufacturing device according to claim 1, wherein said introduction pipe is connected near an upper portion of said process chamber.

3. The semiconductor manufacturing device according to claim 2, further comprising a carrier gas introduction pipe connected to said process chamber for introducing carrier gas into said process chamber.

4. The semiconductor manufacturing device according to claim 1, further comprising a carrier gas introduction pipe connected to said process chamber for introducing the carrier gas into said process chamber.

5. A method of removing a particle from a semiconductor manufacturing device with a process chamber having an exhaust means for performing a prescribed process on a semiconductor substrate, comprising:
   the step of introducing prescribed liquid or gas into said process chamber; and
   the step of solidifying or liquefying said introduced liquid or gas using the particle in said process chamber as a core by depressurizing said process chamber to prescribed pressure by said exhaust means.

6. The method of removing a particle from a semiconductor manufacturing device according to claim 5, wherein said depressurizing step is performed before introducing said liquid or gas into said process chamber.

7. The method of removing a particle from a semiconductor manufacturing device according to claim 6, further comprising the step of evacuating said process chamber by said exhaust means after said solidifying or liquefying step.

8. The method of removing a particle from a semiconductor manufacturing device according to claim 7, further comprising:
   the step of further introducing said liquid or gas into said process chamber after the step of evacuating said process chamber and solidifying or liquefying said introduced liquid or gas by said exhaust means; and
   the step of evacuating said process chamber by said exhaust means.

9. The method of removing a particle from a semiconductor manufacturing device according to claim 8, further comprising the step of introducing carrier gas into said process chamber simultaneously with the step of evacuating said process chamber.

10. The method of removing a particle from a semiconductor manufacturing device according to claim 9, wherein inactive gas or dry air is used as said carrier gas.

11. The method of removing a particle from a semiconductor manufacturing device according to claim 6, wherein the step of evacuating said process chamber by said exhaust means is performed simultaneously with said solidifying or liquefying step.

12. The method of removing a particle from a semiconductor manufacturing device according to claim 11, further comprising the step of introducing carrier gas into said process chamber simultaneously with the step of evacuating said process chamber.

13. The method of removing a particle from a semiconductor manufacturing device according to claim 5, further comprising the step of evacuating said process chamber by said exhaust means after said solidifying or liquefying step.

14. The method of removing a particle from a semiconductor manufacturing device according to claim 13, further comprising:
   the step of further introducing said liquid or gas into said first chamber and solidifying or liquefying said liquid or gas introduced by said exhaust means after the step of evacuating said process chamber; and
   the step of evacuating said process chamber by said exhaust means.

15. The method of removing a particle from a semiconductor manufacturing device according to claim 14, further comprising the step of introducing carrier gas into said process chamber simultaneously with the step of evacuating said process chamber.

16. The method of removing a particle from a semiconductor manufacturing device according to claim 5, wherein said step of evacuating said process chamber by said exhaust means is performed simultaneously with said solidifying or liquefying step.

17. The method of removing a particle from a semiconductor manufacturing device according to claim 16, comprising the step of introducing carrier gas into said process chamber simultaneously with the step of evacuating said process chamber.

18. The method of removing a particle from a semiconductor manufacturing device according to claim 5, wherein said liquid or gas is introduced from a vicinity of an upper portion of said first chamber as the step of introducing said liquid or gas.

19. The method of removing a particle from a semiconductor manufacturing device according to claim 5, wherein one of liquid water, water vapor or carbon dioxide is used as said liquid or gas.

* * * * *